(12) United States Patent
Sandow et al.

(10) Patent No.: US 12,266,680 B2
(45) Date of Patent: Apr. 1, 2025

(54) VOLTAGE-CONTROLLED SWITCHING DEVICE WITH RESISTIVE PATH

(71) Applicant: Infineon Technologies Dresden GmbH & Co. KG, Dresden (DE)

(72) Inventors: Christian Philipp Sandow, Haar (DE); Anton Mauder, Kolbermoor (DE); Franz-Josef Niedernostheide, Hagen a. T.W. (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 510 days.

(21) Appl. No.: 17/487,927

(22) Filed: Sep. 28, 2021

(65) Prior Publication Data

US 2022/0102478 A1 Mar. 31, 2022

(30) Foreign Application Priority Data

Sep. 29, 2020 (EP) .................................. 20198961

(51) Int. Cl.

| | |
|---|---|
| *H01L 29/739* | (2006.01) |
| *H01L 23/00* | (2006.01) |
| *H01L 29/08* | (2006.01) |
| *H01L 29/417* | (2006.01) |
| *H01L 29/778* | (2006.01) |
| *H01L 29/78* | (2006.01) |

(Continued)

(52) U.S. Cl.
CPC .............. *H01L 28/20* (2013.01); *H01L 24/48* (2013.01); *H01L 29/0804* (2013.01); *H01L 29/086* (2013.01); *H01L 29/41741* (2013.01); *H01L 29/739* (2013.01); *H01L 29/7397* (2013.01); *H01L 29/7786* (2013.01); *H01L 29/7787* (2013.01); *H01L 29/7803* (2013.01); *H01L 29/7813* (2013.01); *H03K 3/012* (2013.01); *H01L 2224/48137* (2013.01); *H01L 2224/48472* (2013.01); *H01L 2924/1207* (2013.01); *H01L 2924/13055* (2013.01); *H01L 2924/13064* (2013.01); *H01L 2924/13091* (2013.01)

(58) Field of Classification Search
CPC ..... H01L 28/20; H01L 24/48; H01L 29/0804; H01L 29/41741; H01L 29/7397; H01L 29/7787; H01L 29/7813; H01L 2224/48742; H01L 29/13055; H01L 29/7786; H01L 29/739
USPC .................................................. 257/355–360
See application file for complete search history.

(56) References Cited

U.S. PATENT DOCUMENTS 5,962,893 A 10/1999 Omura et al.
9,786,778 B1 * 10/2017 Morizuka ........... H01L 29/1608
(Continued)

FOREIGN PATENT DOCUMENTS

EP 1104027 A2 5/2001

*Primary Examiner* — Danny Nguyen
(74) *Attorney, Agent, or Firm* — Murphy, Bilak & Homiller, PLLC

(57) ABSTRACT

A voltage-controlled switching device includes a drain/drift structure formed in a semiconductor portion with a lateral cross-sectional area $A_Q$, a source/emitter terminal, and an emitter channel region between the drain/drift structure and the source/emitter terminal. A resistive path electrically connects the source/emitter terminal and the emitter channel region. The resistive path has an electrical resistance of at least $0.1\ m\Omega \cdot cm^2/A_Q$.

19 Claims, 10 Drawing Sheets

(51) Int. Cl.
    *H01L 49/02*     (2006.01)
    *H03K 3/012*     (2006.01)

(56) References Cited

U.S. PATENT DOCUMENTS

| | | | |
|---|---|---|---|
| 2009/0014754 A1* | 1/2009 | Yoshikawa | H01L 29/7397 |
| | | | 257/E29.198 |
| 2009/0020852 A1* | 1/2009 | Harada | H01L 29/7397 |
| | | | 257/579 |
| 2018/0025962 A1* | 1/2018 | Dede | H01L 29/1602 |
| | | | 257/712 |
| 2020/0303506 A1* | 9/2020 | Kiyosawa | H01L 27/088 |
| 2020/0401172 A1* | 12/2020 | Richmond | H03K 17/74 |

* cited by examiner

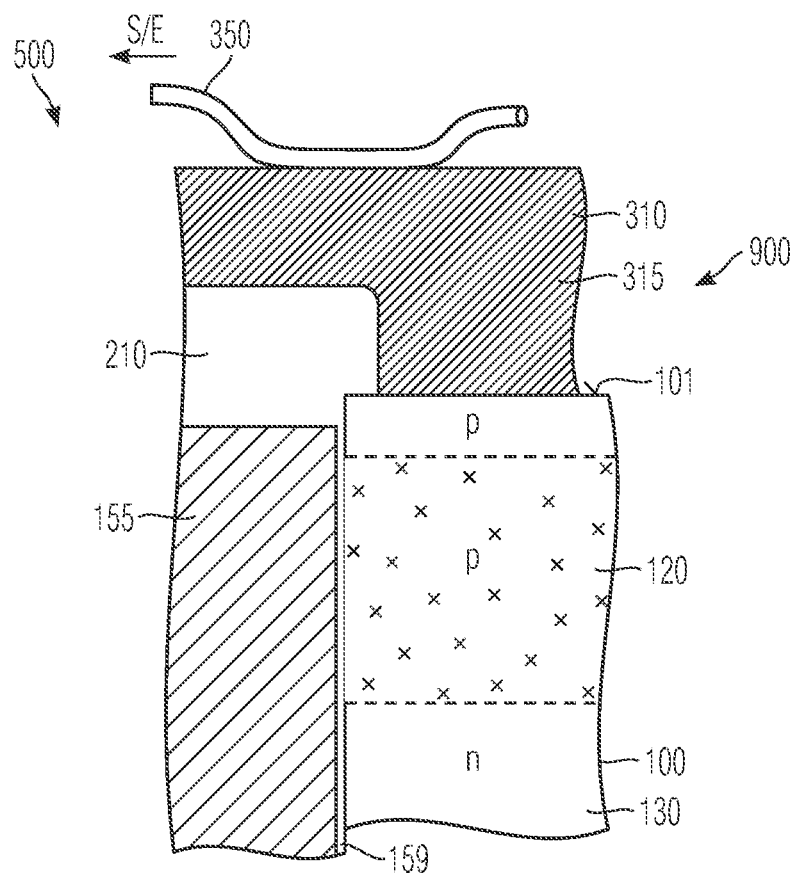

VOLTAGE-CONTROLLED SWITCHING DEVICE WITH RESISTIVE PATH

TECHNICAL FIELD

Examples of the present disclosure relate to a voltage-controlled semiconductor device, in particular to a power switching device with high areic transconductance.

BACKGROUND

Power semiconductor devices are typically used as switches and rectifiers in electric circuits for transforming electrical energy such as DC/AC converters, AC/AC converters and AD/CC converters, and in electric circuits that drive heavy inductive loads, e.g., in motor driver circuits. Typical applications require high short circuit ruggedness, often in combination with an overcurrent protection circuit that switches off the power semiconductor device before the short-circuit current begins to irreversibly damage the power semiconductor device.

There is a need for semiconductor devices that efficiently handle short-circuit conditions.

SUMMARY

An embodiment of the present disclosure relates to a voltage-controlled switching device that includes a drain/drift structure formed in a semiconductor portion, a source/emitter terminal, and an emitter channel region between the drain/drift structure and the source/emitter terminal. The semiconductor portion has a lateral cross-sectional area $A_Q$. A resistive path electrically connects the source/emitter terminal and the emitter channel region. The resistive path has an electrical resistance of at least $0.1 \, m\Omega*cm^2/A_Q$.

Another embodiment of the present disclosure relates to a voltage-controlled switching device that includes a drain/drift structure formed in a semiconductor portion, a source/emitter terminal, and an emitter channel region between the drain/drift structure and the source/emitter terminal. The emitter channel region and the drain/drift structure form a first semiconductor junction. A gate electrode is configured to temporarily induce a charge carrier channel in a gated portion of the emitter channel region. In the gated portion a mean minority charge carrier mobility at a temperature of 25° C. is at most $1000 \, cm^2/(Vs)$ in case the minority charge carriers are electrons and at most $400 \, cm^2/(Vs)$ in case the minority charge carriers are holes.

A further embodiment of the present disclosure relates to a switching assembly that includes a first load wiring structure and a voltage-controlled switching device. The voltage-controlled switching device includes a drain/drift structure and an emitter channel region formed in a semiconductor portion 100 with a lateral cross-sectional area $A_Q$. The voltage-controlled switching device further includes a source/emitter terminal, wherein the source/emitter terminal and the emitter channel region are electrically connected and wherein the emitter channel region is formed between the source/emitter terminal and the drain/drift structure. A resistor element is electrically connected between the source/emitter terminal and the first load wiring structure. An electrical resistance of the resistor element is at least $0.1 \, m\Omega*cm^2/A_Q$.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a semiconductor device and together with the description serve to explain principles of the embodiments. Further embodiments are described in the following detailed description and the claims.

FIG. 9 shows a schematic vertical cross-sectional view of a portion of a semiconductor device according to an embodiment related to an emitter channel region with low charge carrier mobility.

DETAILED DESCRIPTION

Figure 1A:
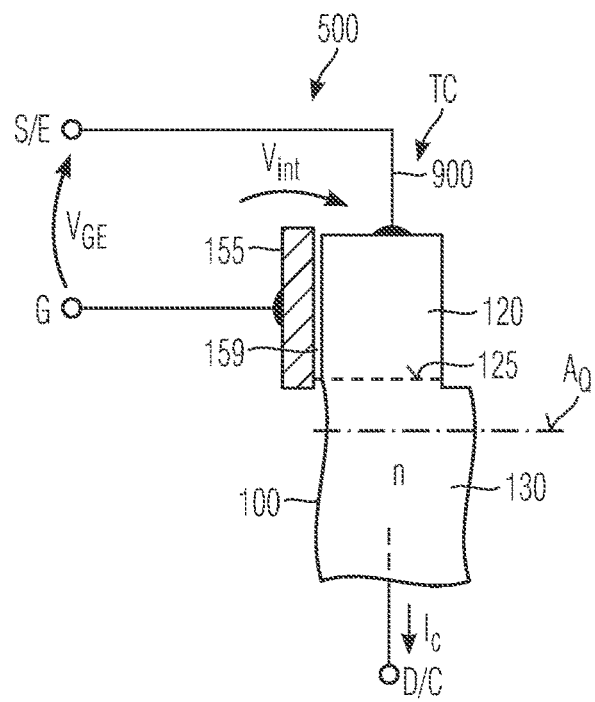
FIG. 1A shows a simplified vertical cross-sectional view of a portion of a semiconductor device with resistive path between source/emitter terminal and emitter channel region according to an embodiment.

In the following detailed description, reference is made to the accompanying drawings, which form a part hereof and in which are shown by way of illustrations specific embodiments in which a voltage-controlled switching device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal and/or power transmission may be connected between the electrically coupled elements, for example, elements that are controllable to temporarily provide a low-resistive connection in a first state and a high-resistive electric decoupling in a second state.

A safe operating area (SOA) defines voltage and current conditions over which a semiconductor device can be expected to operate without self-damage. The SOA is given by published maximum values for device parameters like maximum continuous load current, maximum gate voltage and others.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa.

As regards structures and doped regions formed in a semiconductor body, a second region is "below" a first region if a minimum distance between the second region and a first surface at the front side of the semiconductor body is greater than a maximum distance between the first region and the first surface. The second region or a junction is "directly below" the first region, where the vertical projections of the first and second regions or the vertical projections of the first region and the junction into the first surface overlap. The vertical projection is a projection orthogonal to the first surface. A "horizontal plane" is a plane parallel to a planar first surface or parallel to coplanar surface sections of the first surface.

A voltage-controlled switching device may include a drain/drift structure formed in a semiconductor portion.

The semiconductor portion may have two essentially parallel main surfaces, which may have approximately the same shape and size. The semiconductor portion may have a surface extension along two horizontal directions. The semiconductor portion may have a thickness along a vertical direction perpendicular to the horizontal directions. In the following, the horizontal directions are also referred to as lateral directions. The main surface at the front side is referred to as first surface. The main surface at the side of the semiconductor portion opposite to the front side is referred to as second surface.

The semiconductor portion includes a semiconducting part formed from one or more single crystalline semiconductors. In addition to the semiconducting part, the semiconductor portion may include functional structures from other materials like polycrystalline silicon, dielectrics, elemental metals, metal compounds and/or metal alloys. The functional structures may be formed in trenches extending from the first or second surface into the semiconductor portion or may be formed on the first surface and/or on the second surface. The semiconductor portion has a lateral cross-sectional area $A_Q$.

The drain/drift structure may be or may include a doped drain/drift region including a lightly doped drift zone of a first conductivity type within the semiconductor portion. For example, the drain/drift structure may form or may include a horizontal layer extending laterally through the semiconductor portion. The drain/drift structure may be or may include a layer grown by epitaxy. Alternatively, the drain/drift structure may include a drain-side portion of a heterojunction along which a 2DEG (two-dimensional electron gas) forms.

The voltage-controlled switching device may further include a source/emitter terminal. The source/emitter terminal may be or may include a metallic load pad formed on the first surface of the semiconductor portion. Alternatively, the source/emitter terminal may include a metal terminal lead originally formed as part of a lead frame and then separated from other portions of the lead frame. A bond wire, metal clip, solder layer and/or resistive structure may electrically connect the terminal lead and a first metal load structure, e.g. a metallic load pad formed on the first surface of the semiconductor portion.

The voltage-controlled switching device may include an emitter channel region. The emitter channel region may be a doped region of the semiconductor portion or may include a channel portion of a heterojunction along which a 2DEG forms. In case the emitter channel region is a doped region, the emitter channel region and the drain/drift structure may form a first semiconductor junction, e.g. a unipolar junction or a pn junction.

In an on-state of the voltage-controlled switching device a conductive channel may form in the emitter channel region. The conductive channel may be formed in a gated portion of the emitter channel region, wherein the conductive channel may form when an internal voltage Vint effective between a gate electrode and the emitter channel region exceeds an effective threshold voltage Veffth.

For example, the emitter channel region may be or may include the body region of a transistor cell that further includes a source region, wherein the emitter channel region and the drain/drift structure form a first semiconductor junction, e.g. a pn junction and wherein the emitter channel region and the source region form a second semiconductor junction, e.g. a pn junction. Alternatively, the conductive channel may form across the complete cross-section of the emitter channel region orthogonal to a current flow direction. For example, the emitter channel region may be a nano wire structure (German: "Nanodrahtstruktur") of a switching device, e.g. an insulated gate bipolar device, using volume inversion (in the following: voltage-controlled nano wire device). Alternatively, the conductive channel may include a portion of a 2DEG.

A resistive path may electrically connect the source/emitter terminal and the emitter channel region. The resistive path may have an electrical resistance $R_{rp}$ of at least 0.1 $m\Omega * cm^2/A_Q$. The electrical resistance of the resistive path $R_{rp}$ of at least 0.1 $m\Omega * cm^2/A_Q$ is significantly higher than in conventional voltage-controlled switching devices. For example, the electrical resistance $R_{rp}$ may be at least 0.5 $m\Omega * cm^2/A_Q$ or at least 1 $m\Omega * cm^2/A_Q$.

The resistive path between the source/emitter terminal and the emitter channel region may include at least one of a semiconducting section, a metal portion and an ohmic contact between the semiconducting section and the metal portion.

The resistive path is part of the load branch of the voltage-controlled switching device. Since a high electrical resistance of the load branch increases static losses, conventional IGBTs (insulated gate bipolar transistors) are typically designed so that an electrical resistance between the source/emitter terminal and the gated portion of the emitter channel region is as low as possible. Therefore, the electrical resistance of the resistive path is typically at most 0.01 $m\Omega * cm^2/A_Q$.

But for other voltage-controlled switching devices a sufficiently high electrical resistance between the source/emitter terminal and the emitter channel region can cause the voltage drop across the resistive path to reduce the internal voltage Vint between a gate electrode and the emitter channel region to such an extent that the saturation current is significantly reduced. This applies, for example, to voltage-controlled switching devices with comparatively high transconductance per unit area ("areic transconductance" in the following).

The transconductance for voltage-controlled switching devices is given by the change of the load current through a load path of the voltage-controlled switching device divided by the corresponding change of a control voltage applied to the voltage-controlled switching device. For example, the transconductance of an MOSFET is given by the change of the drain current ID divided by the respective change of the gate-to-source voltage VGS. The transconductance of an IGBT is given by the change of the collector current IC divided by the respective change of the gate-to-emitter voltage VGE. For voltage-controlled switching devices, transconductance can be adjusted by providing the switching device with an appropriate number of transistor cells electrically connected in parallel, wherein all transistor cells are controlled through the same control voltage and wherein the load currents of all transistor cells add up.

Since the transconductance is a linear function of the number of transistor cells and thus a linear function of the active area, under the conditions of the same cell design and manufacturing process the transconductance of a voltage controlled switching device with a cross-sectional area twice that of a reference switching device is approximately twice that of the reference switching device.

By contrast, the areic transconductance (German: flächenbezogene Steilheit) indicates a design-specific transconductance that is directly proportional to the transconductance of one single transistor cell. The resistive path between the source/emitter terminal and the emitter channel region unfolds the effects on which the embodiments rely in particular in combination with voltage-controlled switching devices with an areic transconductance significantly higher than in conventional MOSFETs and IGBTs.

With the resistive path having the electrical resistance specified above it is possible to provide voltage-controlled switching devices with improved intrinsic short-circuit ruggedness.

With the electrical resistance of the resistive path as specified above it is possible that across the resistive path the saturation current of the voltage-controlled switching device causes a voltage drop of at least 50% of the effective threshold voltage, wherein the effective threshold voltage is defined as that internal voltage between gate electrode and the emitter channel region, at which the load current is 100 µA.

At the effective threshold voltage an inversion layer or accumulation layer forming in the emitter channel region is sufficiently strong to carry a load current IC of 100 µA through the emitter channel regions of the voltage-controlled switching device. Alternatively, volume inversion in the emitter channel region may take place, when the internal voltage between gate electrode and the emitter channel region exceeds the effective threshold voltage.

In both cases, the effective threshold voltage is given by physical parameters of the voltage-controlled switching device. In addition, the effective threshold voltage and the electrical resistance may be obtained by measuring parameters of the voltage-controlled switching device under different gate-to-emitter voltages VGE and load conditions, e.g. by using models including "emitter parasitic series resistance" and/or "emitter ohmic resistance".

According to an embodiment the voltage-controlled switching device may include a gate electrode configured to temporarily induce a charge carrier channel in a gated portion of the emitter channel region. The charge carrier channel may be or may include an inversion channel, an accumulation channel of a section of a 2DEG The resistive path may include a source-side structure located between the source/emitter terminal and the gated portion of the emitter channel region, wherein the source-side structure may be formed in the semiconductor portion.

The source-side structure may include a non-gated portion of the emitter channel region. In addition or alternatively, the source-side structure may include a further semiconducting region or a source-side portion of a 2DEG.

An electrical resistance $R_{sem}$ of the source-side structure may be at least 0.1 $m\Omega * cm^2/A_Q$. For example, the electrical resistance $R_{sem}$ may be at least 0.5 $m\Omega * cm^2/A_Q$ or at least 1 $m\Omega * cm^2/A_Q$.

According to an embodiment the source-side structure may include a semiconducting section located between the first surface of the semiconductor portion and the gated portion of the emitter channel region. The semiconducting section may be a section of the semiconducting part of the semiconductor portion between the source/emitter terminal, e.g. between a load pad and the gated portion of the emitter channel region.

For example, the emitter channel region may include a non-gated portion between the first surface of the semiconductor portion and the gated portion. In addition or alternatively, the semiconducting section may include a further semiconducting region between the first surface and the gated portion, wherein the further semiconducting region and the emitter channel region may form a second semiconductor junction, e.g. a unipolar junction or a pn junction.

Vertical extension, impurity concentration, charge carrier mobility, and/or porosity of the semiconducting section can be selected such that at least 20%, at least 90% or almost 100% of the target voltage drop across the resistive path occurs across the semiconductor section.

According to another embodiment the voltage-controlled switching device may include a heterojunction, e.g. a heterojunction of two materials with different band gaps, wherein a 2DEG forms along one side of the heterojunction.

For example, the voltage-controlled switching device may be or may include a normally-on HEMT, a normally-off MOS-gated HEMT or a normally-off GIT (gate injection transistor) and a drain-side portion of the heterojunction including a drain-side portion of the 2DEG forms the drain/drift structure.

The source-side structure includes a source-side portion of the heterojunction between the source/emitter terminal and the emitter channel region, wherein the source-side portion of the heterojunction includes a source-side portion of the 2DEG.

The emitter channel region electrically connects the source-side portion and the drain-side portion. In case of a normally-on HEMT, the emitter channel region may include a further portion of the heterojunction and the 2DEG. In case of a normally-off MOS-gated HEMT, the emitter channel region may include a doped region in which an inversion or accumulation layer is formed in the on-state, wherein the inversion or accumulation layer electrically connects the source-side portion and the drain-side portion of the 2DEG. In case of a GIT, the source-side portion and the drain-side portion may be laterally separated in the off-state and connectable through charge carriers injected through an injection layer controlled by the gate electrode.

Along the source side-portion the 2DEG is less dense and/or has a lower effective width than along the drain-side portion. The source-side portion forms part of the resistive path electrically connecting the source/emitter terminal and the emitter channel region.

According to an embodiment the resistive path may include a metal/semiconductor contact. The metal/semiconductor contact may be or may include an ohmic contact between the source/emitter terminal and the semiconductor portion. For example, a first metal load structure, e.g. a load pad, and the emitter channel region may form the metal/semiconductor contact. Alternatively, the first metal load structure and a doped region between the first metal load structure and the emitter channel region may form the metal/semiconductor contact.

An electrical contact resistance $R_{con}$ of the metal/semiconductor contact may be at least 0.1 mΩ*cm$^2$/$A_Q$. For example, the electrical contact resistance $R_{con}$ may be at least 0.5 mΩ*cm$^2$/$A_Q$ or at least 1 mΩ*cm$^2$/$A_Q$.

The metal of the metal/semiconductor contact may be an elemental metal, a metal alloy or a metal compound, e.g., a metal nitride or a metal silicide. The metal of the metal/semiconductor contact may form a portion of a load pad formed at a front side of the semiconductor portion. The contact area and the specific contact resistivity of the metal/semiconductor contact may be selected such that at least 20%, e.g. at least 90% or nearly 100% of the target voltage drop occurs across the metal/semiconductor contact.

According to an embodiment the resistive path may include a resistive structure. The resistive structure may be a one-part structure or may include at least two spatially separated parts which are electrically connected in series. The resistive structure may be formed between the source/emitter terminal and the semiconducting section. For example, the resistive structure or a part thereof may be in contact with a terminal lead and/or may be in contact with the semiconductor portion.

An electrical resistance $R_{str}$ of the resistive structure may be at least 0.1 mΩ*cm$^2$/$A_Q$. For example, the electrical resistance $R_{str}$ may be at least 0.5 mΩ*cm$^2$/$A_Q$ or at least 1 mΩ*cm$^2$/$A_Q$.

For example, dimensions and/or material of the resistive structure can be selected such that at least 20%, at least 90% or almost 100% of the target voltage drop across the resistive path occurs across the resistive structure.

The resistive structure forms a sufficiently high-ohmic resistive path in an efficient way.

According to an embodiment the resistive structure may be formed between the semiconducting section and a metal load pad, which is formed on the semiconducting section, wherein a metal connection structure, e.g. a metal clip and/or a bond wire, may connect the metal load pad and the source/emitter terminal. The resistive structure may include one single layer or at least two sub-layers of different composition and/or different physical configuration.

According to an embodiment the resistive path may include a resistive element that may be located between the source/emitter terminal and the metal load structure.

The source/emitter terminal may be a terminal lead. The connection element may be or may include a bond wire and/or a metal clip connecting the terminal lead and the load pad. The resistive structure may include a polycrystalline structure and/or a metallic structure, wherein the metallic structure includes at least one of elemental metal, metal alloy and metal compound.

An electrical resistance $R_{ele}$ of the resistive element may be at least 0.1 mΩ*cm$^2$/$A_Q$. For example, the electrical resistance $R_{ele}$ may be at least 0.5 mΩ*cm$^2$/$A_Q$ or at least 1 mΩ*cm$^2$/$A_Q$.

For example, dimensions and/or material of the resistive element can be selected such that at least 20%, at least 90% or almost 100% of the target voltage drop across the resistive path occurs across the resistive element.

Another voltage-controlled switching device may include a drain/drift structure formed in a semiconductor portion. The drain/drift structure may be a doped region of a first conductivity type within the semiconductor portion. The drain/drift structure may form or may include a horizontal layer extending laterally through the semiconductor portion. The drain/drift structure may be or may include a layer grown by epitaxy.

The voltage-controlled switching device may further include a source/emitter terminal. The source/emitter terminal may be or may include a metallic load pad formed on the first surface of the semiconductor portion. Alternatively, the source/emitter terminal may include a metal terminal lead originally formed as part of a lead frame and then separated from other portions of the lead frame. A bond wire, metal clip, solder layer and/or resistive structure may electrically connect the terminal lead and a metallic load pad formed on the first surface of the semiconductor portion.

The voltage-controlled switching device may include an emitter channel region. The emitter channel region may be a doped region of the semiconductor portion. The emitter channel region and the drain/drift structure may form a first semiconductor junction, e.g. a unipolar junction or a pn junction.

The voltage-controlled switching device may further include a gate electrode configured to temporarily induce a charge carrier channel a volume-inversion in a gated portion of the emitter channel region. A gate dielectric may separate the gated portion and the gate electrode. In the gated portion a mean minority charge carrier mobility at a temperature of 25° C. is at most 1000 cm$^2$/(Vs) or at most 140 cm$^2$/(Vs) in case the minority charge carriers are electrons and at most 400 cm$^2$/(Vs) or at most 50 cm$^2$/(Vs) in case the minority charge carriers are holes.

In an on-state of the voltage-controlled switching device a conductive channel forms in the emitter channel region. The conductive channel may be formed in a gated portion of the emitter channel region, wherein the conductive channel forms when an internal voltage Vint effective between a gate electrode and the emitter channel region exceeds an effective threshold voltage Veffth.

For example, the emitter channel region may be or may include the body region of a transistor cell that further includes a source region, wherein the emitter channel region and the drain/drift structure form a first semiconductor junction, e.g. a pn junction, and wherein the emitter channel region and the source region form a second semiconductor junction, e.g. a pn junction. The conductive channel may form in a layer along the gate dielectric or may form across the complete cross-section of the emitter channel region orthogonal to a current flow direction. For example, the emitter channel region may be a nano wire structure (German: "Nanodrahtstruktur") of an insulated gate bipolar device using volume inversion.

For example, in the emitter channel region a crystal defect density may be higher than outside the emitter channel region and/or a density of electrically inactive (non-doping) impurities such as Carbon (C) and/or Germanium (Ge) is higher than outside the emitter channel region. According to another example, a total impurity concentration in the emitter channel region is at least 1*10$^{19}$ cm$^{-3}$, for example at least 1*10$^{20}$ cm$^{-3}$, or least 1*10$^{21}$ cm$^{-3}$.

The emitter channel region is part of the load branch of the voltage-controlled switching device. Since a low charge carrier mobility in the gated channel increases static losses, conventional IGBTs are typically designed so that the charge carrier mobility in the gated portion is as high as possible. In typical n-channel semiconductor switches electron mobility in the channel is about 1400 cm$^2$/(Vs). In typical p-channel semiconductor switches hole mobility in the channel is about 500 cm$^2$/(Vs).

But for other voltage-controlled switching devices, e.g. voltage-controlled switching devices with comparatively high areic transconductance, a sufficiently low charge carrier mobility in the emitter channel region can cause the voltage drop across the emitter channel region to reduce the internal voltage Vint between the gate electrode and the emitter channel region to such an extent that the saturation current is significantly reduced.

With the emitter channel region having the minority charge carrier mobility as specified above it is possible to provide voltage-controlled switching devices with improved intrinsic short-circuit ruggedness.

With the emitter channel region having the minority charge carrier mobility as specified above it is possible that across the gated portion the saturation current of the voltage-controlled switching device causes a voltage drop of at least 50% of the effective threshold voltage, wherein the effective threshold voltage is defined as that internal voltage between gate electrode and the emitter channel region, at which the load current of the voltage-controlled switching device is 100 µA.

At the effective threshold voltage an inversion layer or accumulation layer forming in the emitter channel region is sufficiently strong to carry a load current IC of 100 µA through the emitter channel region. In other types of voltage-controlled switching devices (e.g. nano wire devices), volume inversion in the emitter channel region takes place, when the internal voltage between gate electrode and the emitter channel region exceeds the effective threshold voltage.

In both cases, the effective threshold voltage is given by physical parameters of the voltage-controlled switching device. In addition, the effective threshold voltage and the electrical resistance may be obtained by measuring parameters of the voltage-controlled switching device under different gate-to-emitter voltages VGE and load conditions, e.g. by using models including "emitter parasitic series resistance" and/or "emitter ohmic resistance".

According to an embodiment, the voltage-controlled switching device may have an areic transconductance of at least 5 kS/cm$^2$, e.g. at least 10 kS/cm$^2$ for each gate-to-emitter voltage within the SOA.

The areic transconductance is a measure of the strength of the gate voltage reach-through on the density of the mobile charge carriers in the emitter channel region. An areic transconductance of 5 kS/cm$^2$ is high compared with the areic transconductance of Si IGBTs, which typically have an areic transconductance of not more than 500 S/cm$^2$. An areic transconductance higher than 1 kS/cm$^2$ typically requires a rather unconventional transistor design for a power semiconductor device, e.g. a fully-depletable channel or a 2DEG.

For voltage-controlled switching devices with an areic transconductance of at least 5 kS/cm$^2$, the resistive path as specified above can reduce the internal voltage Vint effective between the gate electrode and the emitter channel to such an extent that the saturation current is reduced to a value for which the voltage-controlled switching device is rated for continuous duty. The voltage-controlled switching devices can be inherently short-circuit proof.

According to an embodiment an effective threshold voltage Veffth of the voltage-controlled switching device may be at most 1.2V. The effective threshold voltage may be defined as that internal voltage between gate electrode and the emitter channel region, at which the load current is 100 µA.

At the effective threshold voltage an inversion layer or accumulation layer forming in the emitter channel region is sufficiently strong to carry a load current IC of 100 µA through the emitter channel region. In other types of voltage-controlled switching devices (e.g. nano wire devices), volume inversion in the emitter channel region may take place, when the internal voltage between gate electrode and the emitter channel region exceeds the effective threshold voltage.

For voltage-controlled switching devices with an effective threshold voltage of at most 1.2V, the saturation voltage generates a voltage drop across the resistive path and/or across the emitter channel region to such an extent that the saturation current is reduced to a value for which the voltage-controlled switching device is rated for continuous duty. The voltage-controlled switching devices can be inherently short-circuit proof.

According to an embodiment dopant concentration and lateral dimensions of the emitter channel region and a gate-to-channel threshold voltage are selected such that in an on state of the voltage-controlled switching device volume inversion takes place in the emitter channel region.

The emitter channel region has a length extension parallel to the current flow direction and a cross-section orthogonal to the current flow direction. The emitter channel region is "completely in inversion" or "volume-inverted", if at least in a section of the length extension the emitter channel region is in inversion across the complete cross-section. The wording "completely in inversion" and "volume-inverted" may include that end sections of the emitter channel region are not completely in inversion. A transistor cell exhibiting complete inversion in the sense defined above is of the volume-inversion type.

According to an embodiment a smallest lateral dimension of the emitter channel region may be at most 200 nm, e.g. at most 100 nm or at most 50 nm.

According to an embodiment the voltage-controlled switching device may include a source region. The source region may be connected to the source/emitter electrode. The source region and the emitter channel region may form a second semiconductor junction. The emitter channel region may separate the source region and the drain/drift structure.

A switching assembly may include a first load wiring structure. The first load wiring structure may include a metallic pad formed on a substrate. The substrate may be a PCB (printed circuit board) or DCB (direct copper bonded) substrate.

The switching assembly may further include a voltage-controlled switching device. The voltage-controlled switching device may be a MOSFET, a NANOFET, an IGBT, a NANOIGBT, a HEMT or a GIT. The voltage-controlled switching device may be arranged on the substrate. For example, the voltage-controlled switching device may be soldered onto a further metallic pad formed on the substrate.

The voltage-controlled switching device may include a drain/drift structure and an emitter channel region formed in a semiconductor portion with a lateral cross-sectional area $A_Q$. The drain/drift structure may include a doped drain/drift region or a drain-side portion of a 2DEG.

The voltage-controlled switching device may further include a source/emitter terminal. The source/emitter terminal and the emitter channel region may be electrically connected. For example, the source/emitter terminal and the emitter channel region may be directly connected or through a doped semiconducting section.

The emitter channel region may be formed between the source/emitter terminal and the drain/drift structure. The source/emitter terminal, the emitter channel region and the drain/drift structure may be electrically connected in series.

The emitter channel region may be arranged such that charge carrier pass the emitter channel region in an on-state of the voltage-controlled switching device and charge carriers are blocked from passing the emitter channel region in an off-state of the voltage-controlled switching device.

For example, the voltage-controlled switching device may include a gate electrode and a gate dielectric, wherein the gate dielectric is between the gate electrode and the emitter channel region, e.g. between the gate electrode and a gated portion of the emitter channel region. An effective threshold voltage Veffth of the voltage-controlled switching device may be at most 1.2V. An areic transconductance may be at least 5 kS/cm$^2$.

The switching assembly may further include a resistor element. The resistor element may be electrically connected between the source/emitter terminal and the first load wiring structure. An electrical resistance $R_{ele}$ of the resistor element is at least 0.1 mΩ*cm2/$A_Q$. For example, the electrical resistance $R_{ele}$ may be at least 0.5 mΩ*cm$^2$/$A_Q$ or at least 1 mΩ*cm$^2$/$A_Q$. The resistor element may provide inherent short-circuit ruggedness.

According to an embodiment the switching assembly may include a gate driver circuit and a clamping circuit. The gate driver circuit may include a gate output terminal. The gate output terminal and the gate electrode of the voltage-controlled switching device may be electrically connected through a gate input resistor. The gate input resistor may include at least one of a resistor element and a portion of a strip conductor.

The gate driver circuit may output a binary gate output signal at the gate output terminal.

The clamping circuit may clamp, in the on-state of the voltage-controlled switching device, the voltage at the gate electrode to a value not higher than 35% of the high level of the binary gate output signal.

While a Miller clamp keeps the gate signal below the threshold voltage when the gate driver circuit drives the off-level, the clamping circuit may facilitate clamping the high on-level gate signal against overshooting. The clamping circuit may attenuate oscillations that may be caused by the feedback of the collector current on the gate input voltage through the resistive path including the resistive element.

Figure 1B:
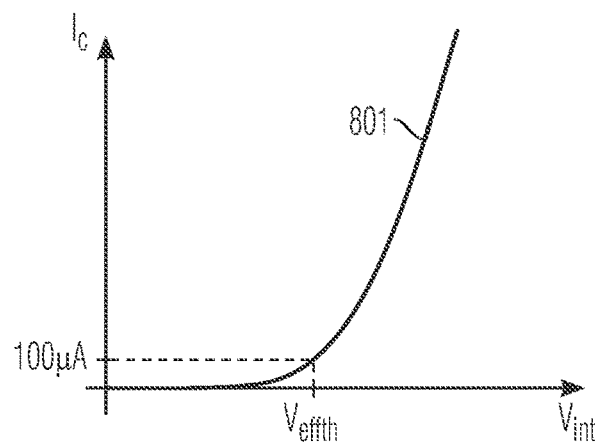
FIGS. 1B and 1C are simplified diagrams illustrating device parameters of the semiconductor device of FIG. 1A FIGS. 2A and 2B show schematic vertical cross-sectional views of portions of semiconductor devices according to embodiments related to resistive paths with resistive semiconducting sections.
Figure 1C:
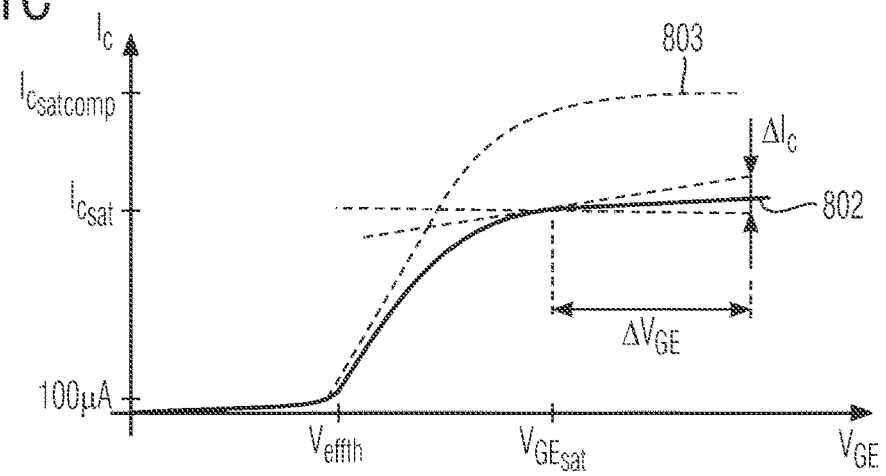

FIGS. 1A to 1C refer to a voltage-controlled switching device 500 with high areic transconductance such as a nano wire device or a HEMT, by way of example.

FIG. 1A shows a transistor cell TC of the voltage-controlled switching device 500 that further includes a source/emitter terminal S/E as first load terminal, a drain/collector terminal D/C as second load terminal and a gate terminal G. A plurality of the transistor cells TC are electrically connected in parallel between the source/emitter terminal S/E and the drain/collector terminal D/C and are controlled through a signal applied to the gate terminal G.

The transistor cells TC are formed in a semiconductor portion 100. The semiconductor portion 100 includes a semiconducting part formed from one or more single crystalline semiconductor(s). The semiconductor (s) may include group IV elemental semiconductors, e.g. silicon (Si) or germanium (Ge), group IV compound semiconductors, e.g. silicon carbide (SiC) or silicon germanium (SiGe), or group III-V semiconductors such as gallium nitride (GaN), aluminum gallium nitride (AlGaN) or gallium arsenide (GaAs), by way of example. For example, the semiconductor may be SiC with a hexagonal polytype like 2H—SiC, 4H—SiC or 6H—SiC. In addition to the main constituent or the main constituents, the semiconductor may include dopant atoms, for example nitrogen (N), phosphorous (P), beryllium (Be), boron (B), aluminum (Al) and/or gallium (Ga). The semiconductor may also include other impurities such as hydrogen (H), fluorine (F) and/or oxygen (O).

The drain/collector terminal D/C is electrically connected or electrically coupled to a drain/drift structure 130 formed in the semiconductor portion 100. The drain/drift structure 130 may extend laterally through the semiconductor portion 100 and may include two or more differently doped sublayers. The drain/collector terminal D/C and the drain/drift structure 130 may be electrically connected through a low-impedance ohmic path. Alternatively, the electrical connection between the drain/drift structure 130 and the drain/collector terminal may include at least one pn junction.

The semiconductor portion 100 has a lateral cross-sectional area $A_Q$ and further includes an emitter channel region

120. The emitter channel region 120 and the drain/drift structure 130 form a first semiconductor junction 125, i.e. a unipolar junction or a pn junction. A resistive path 900 electrically connects the source/emitter terminal S/E and the emitter channel region 120. The resistive path 900 has an electrical resistance $R_{rp}$ of at least 0.1 mΩ*cm²/$A_Q$, at least 0.5 mΩ*cm²/$A_Q$ or at least 1 mΩ*cm²/$A_Q$.

The gate terminal G is electrically connected to a conductive gate electrode 155. A gate dielectric 159 separates the gate electrode 155 and the emitter channel region 120. A gate-to-emitter voltage VGE applied between the gate terminal G and the source/emitter terminal S/E controls the load current IC flowing between the source/emitter terminal S/E and the drain/collector terminal D/C through the transistor cells TC.

In FIG. 1B line 801 plots the load current IC as a function of an internal voltage Vint effective between the gate electrode 155 and the emitter channel region 120. When the internal voltage Vint exceeds an effective threshold voltage Veffth for which the load current IC is 100 μm, the voltage-controlled switching device 500 is defined to be in the on-state. In the on-state, a gated channel forms in the emitter channel region 120. The gated channel includes an inversion layer, an accumulation layer, may result from volume inversion or may include a 2DEG.

In FIG. 1C line 802 plots the load current IC as a function of the gate-to-emitter voltage VGE applied between the gate electrode 155 and the source/emitter terminal S/E. Above a saturation current ICsat for a gate-to-emitter saturation voltage VGEsat, the transconductance AIC/AVGE is at most 10% of the mean transconductance between the effective threshold voltage Veffth and the gate-to-emitter saturation voltage VGEsat. For a load current IC between 100 μA and the saturation current ICsat, the minimum areic transconductance is at least 5 kS/cm².

For the voltage-controlled switching device 500 with an areic transconductance of at least 5 kS/cm², a sufficiently high electrical resistance $R_{rp}$ of the resistive path 900 between the source/emitter terminal S/E and the emitter channel region 120 causes the voltage drop across the resistive path 900 to reduce the internal voltage Vint and, as a consequence, to reduce the saturation current ICsat to such an extent that the voltage-controlled switching device 500 can carry the saturation current ICsat for a predefined time without being irreversibly damaged.

The predefined time may be at least 500 ns allowing a short-circuit protection circuit to break the short-circuit current safely before the short-circuit current damages the voltage-controlled switching device 500. For example, the predefined time is in a range from 500 ns to 3 μs.

In particular, the electrical resistance $R_{rp}$ is selected such that across the resistive path 900 the saturation current ICsat of the voltage-controlled switching device 500 causes a voltage drop of at least 50% of the effective threshold voltage Veffth.

Line 803 plots the load current IC against the gate-to-emitter voltage VGE for a comparative device. The comparative device differs from the voltage-controlled switching device 500 of FIG. 1A only in that the electrical resistance $R_{rp}$ of the resistive path 900 is less than 0.01 mΩ*cm²/$A_Q$. The saturation current ICsatcomp of the comparative device is significantly higher.

Figure 2A:
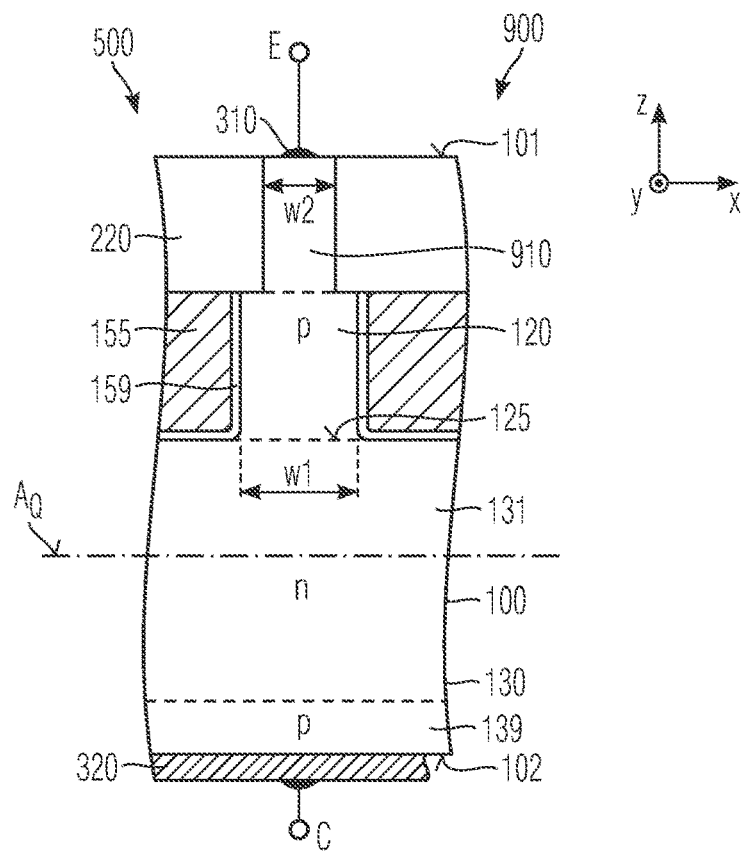
Figure 2B:
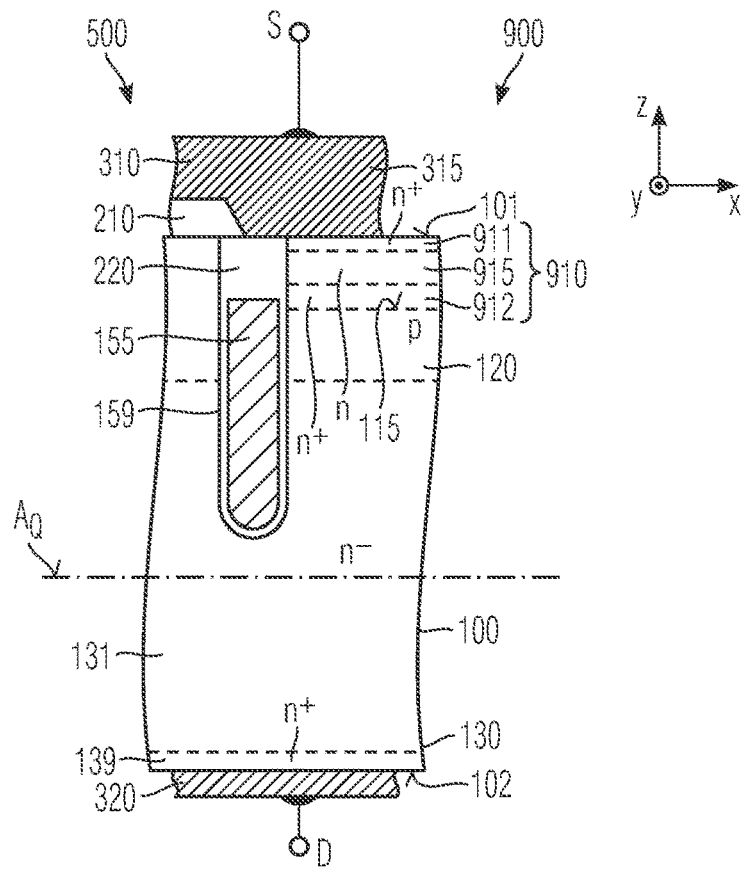

FIGS. 2A and 2B show voltage-controlled switching devices 500 with the resistive path 900 including a semiconducting section 910, which is part of the semiconductor portion 100. The semiconductor portion 100 has a lateral cross-sectional area $A_Q$.

The semiconductor portion 100 has two essentially parallel main surfaces, which may have approximately the same shape and size. The main surface at the front side is referred to as first surface 101 and the main surface opposite to the front side is referred to as second surface 102 in the following.

The semiconductor portion 100 has a surface extension along two horizontal directions. The horizontal directions are parallel to an x-axis and to a y-axis, wherein x-axis and y-axis are orthogonal to each other. The semiconductor portion 100 has a thickness along a vertical direction perpendicular to the horizontal directions. The vertical direction is parallel to a z-axis, which is orthogonal to the x-axis and to the y-axis. In the following, the horizontal directions are also referred to as lateral directions.

A metallic load pad 310 is formed on the first surface 101. The load pad 310 includes at least one of elemental metal, metal alloy and metal compound. For example, the load pad 310 includes at least a portion consisting essentially of elemental aluminum (Al), elemental copper (Cu), aluminum copper alloy (AlCu), aluminum silicon copper alloy (AlSiCu), tungsten (W), titanium (Ti), titanium nitride (TiN), tantalum (Ta), tantalum nitride (TaN) or a metal silicide.

A metal layer 320 is formed on the second surface 102. The metal layer 320 includes at least one of elemental metal, metal alloy and metal compound. For example, the metal layer 320 includes at least a portion consisting essentially of Al, Cu, AlCu, AlSiCu, W, Ti, TiN, Ta, TaN, or a metal silicide.

A drain/drift structure 130 extends laterally through the semiconductor portion 100. The drain/drift structure 130 includes a weakly doped n conductive drift zone 131 and a heavily doped contact structure 139 located between the drift zone 131 and the second surface 102. The contact structure 139 and the metal layer 320 form a low-resistive ohmic contact.

An emitter channel region 120 is formed between the first surface 101 and the drain/drift structure 130. The emitter channel region 120 and the drain/drift structure 130 form a first semiconductor junction 125.

The emitter channel region 120 may have two orthogonal lateral dimensions within the same order of magnitude, e.g. two approximately equal lateral dimensions along the x-axis and along the y-axis. Alternatively, the emitter channel region 120 may be stripe-shaped with a length along the y-axis and a width w1 along the x-axis. The width w1 may be at most 200 nm, e.g. at most 100 nm or at most 50 nm.

In the illustrated embodiments the emitter channel region 120 is p conductive and the first semiconductor junction 125 is a pn junction. According to other embodiments (not illustrated) the emitter channel region 120 is n conductive and the first semiconductor junction 125 is a unipolar junction, e.g. an n⁻/n or n⁻/n⁺ junction.

A gate electrode 155 is formed in a trench or in trenches extending from the first surface 101 into the semiconductor portion 100. A gate dielectric 159 is formed between the gate electrode 155 and the emitter channel region 120

The semiconducting section 910 is formed between the load pad 310 and the emitter channel region 120. An insulator structure 220 is formed between the first surface 101 and the gate electrode 155 and laterally confines the semiconducting section 910. The insulator structure 220 and the gate electrode 150 may be formed in the same trench.

The semiconducting section 910 and the emitter channel region 120 may have the same mean impurity concentration, the same conductivity type, the same porosity and/or the same lateral dimensions. Alternatively, the semiconducting section 910 and the emitter channel region 120 differ in at least one of mean impurity concentration, porosity, width and length.

FIG. 2A refers to an IGBT with a p conductive contact structure 139, an emitter terminal E as first load terminal and a collector terminal C as second load terminal. The emitter terminal E may be the load pad 310 or a terminal lead electrically connected to the load pad 310, e.g. through a bond wire or a metal clip. The collector terminal C may be the metal layer 320 or may be a terminal lead electrically connected to the metal layer 320, e.g. through a bond wire or a metal clip.

The gate electrode 155 may include two portions on opposite sides of the emitter channel region 120. A width w2 of the semiconducting section 910 along the x-axis is smaller than the corresponding width w1 of the emitter channel region 120. The gate electrode 155 is formed in a narrow lower portion and the insulator structure 220 is formed in a wide upper portion of the same trench.

A resistive path 900 electrically connecting the emitter terminal E and the emitter channel region 120 includes a connection between the emitter terminal E and the load pad 310, the load pad 310, a metal/semiconductor contact between the load pad 310 and the semiconducting section 910, and the semiconducting section 910. The resistive path 900 has an electrical resistance $R_{rp}$ of at least 1 mΩ*cm$^2$/$A_Q$. The semiconducting section 910 has an electrical resistance $R_{sem}$ of at least 0.1 mΩ*cm$^2$/$A_Q$, at least 0.5 mΩ*cm$^2$/$A_Q$ or at least 1 mΩ*cm$^2$/$A_Q$.

FIG. 2B refers to a MOSFET (metal oxide semiconductor field effect transistor) with n conductive contact structure 139, with a source terminal S as first load terminal and a with drain terminal D as second load terminal. The source terminal S may be the load pad 310 or a terminal lead electrically connected to the load pad 310, e.g. through a bond wire or a metal clip. The drain terminal D may be the metal layer 320 or may be a terminal lead electrically connected to the metal layer 320, e.g. through a bond wire or a metal clip.

An interlayer dielectric 210 may separate the load pad 310 and portions of the first surface 101. The load pad 310 may include a contact structure 315 extending through an opening in the interlayer dielectric 210 down to or into the semiconductor portion 100, wherein the contact structure 315 and the semiconducting section 910 form an ohmic contact.

The semiconducting section 910 may include a first heavily doped portion 911 along the first surface 101, wherein the first heavily doped portion 911 and the contact structure 315 form an ohmic contact.

A second heavily doped portion 912 is in contact with the emitter channel region 120, wherein the second heavily doped portion 912 and the emitter channel region 120 form a second semiconductor junction 115. An intermediate portion 915 separates the first heavily doped portion 911 and the second heavily doped portion 912 from each other. The intermediate portion 915 has a higher resistivity than the first and second heavily doped portions 911, 912. For example, the net dopant concentration in the intermediate portion 915 is lower than in the first and second heavily doped portions 911, 912.

A resistive path 900 electrically connecting the source terminal S and the emitter channel region 120 includes a connection between the source terminal S and the load pad 310, the load pad 310, a metal/semiconductor contact between the load pad 310 and the semiconducting section 910, and the semiconducting section 910. The resistive path 900 has an electrical resistance $R_{rp}$ of at least 1 mΩ*cm$^2$/$A_Q$. The semiconducting section 910 has an electrical resistance $R_{sem}$ of at least 0.1 mΩ*cm$^2$/$A_Q$, at least 0.5 mΩ*cm$^2$/$A_Q$ or at least 1 mΩ*cm$^2$/$A_Q$.

Figure 3:
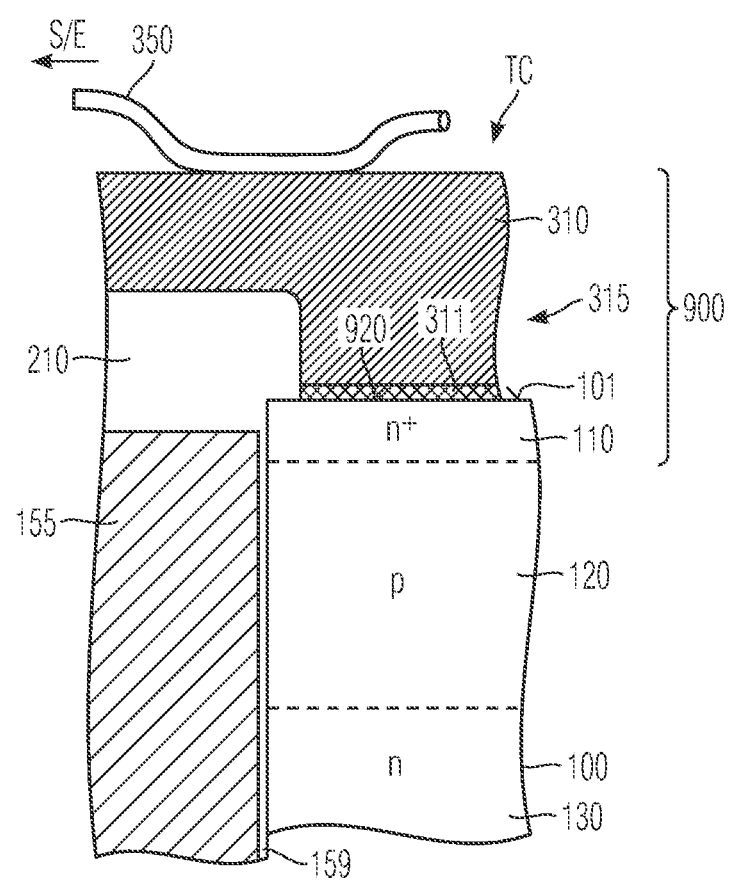
FIG. 3 shows a schematic vertical cross-sectional view of a portion of a semiconductor device according to an embodiment related to a resistive path with a metal/semiconductor contact.

In FIG. 3 the resistive path 900 includes an ohmic metal/semiconductor contact 920 with comparatively high contact resistance. The metal/semiconductor contact 920 is an ohmic contact formed along an interface between the load contact structure 315 and the semiconductor portion 100. In the illustrated embodiment, the transistor cell TC includes a source region 110 between the load pad 310 and the emitter channel region 120, wherein the metal/semiconductor contact 920 is formed along the interface between the load contact structure 315 and the source region 110. According to embodiments without source region (not illustrated), the ohmic contact may be formed along an interface between the load contact structure 315 and the emitter channel region 120.

The load contact structure 315 includes a contact layer 311 in contact with the semiconductor portion 100. The contact layer 311 may be metallic. For example, the contact layer 311 includes a metal silicide and/or a metal nitride.

The resistive path 900 includes a connection element 350 that connects the load pad 310, which includes the load contact structure 315 and the contact layer 311, and a source/emitter terminal S/E. The connection element 350 may include a bond wire and/or a metal clip, by way of example. The resistive path 900 further includes the load pad 310, the metal/semiconductor contact 920 and the source region 110. The resistive path 900 has an electrical resistance $R_{rp}$ of at least 1 mΩ*cm$^2$/$A_Q$. The metal/semiconductor contact 920 has an electrical contact resistance $R_{con}$ of at least 0.1 mΩ*cm$^2$/$A_Q$, at least 0.5 mΩ*cm$^2$/$A_Q$ or at least 1 mΩ*cm$^2$/$A_Q$.

Figure 4:
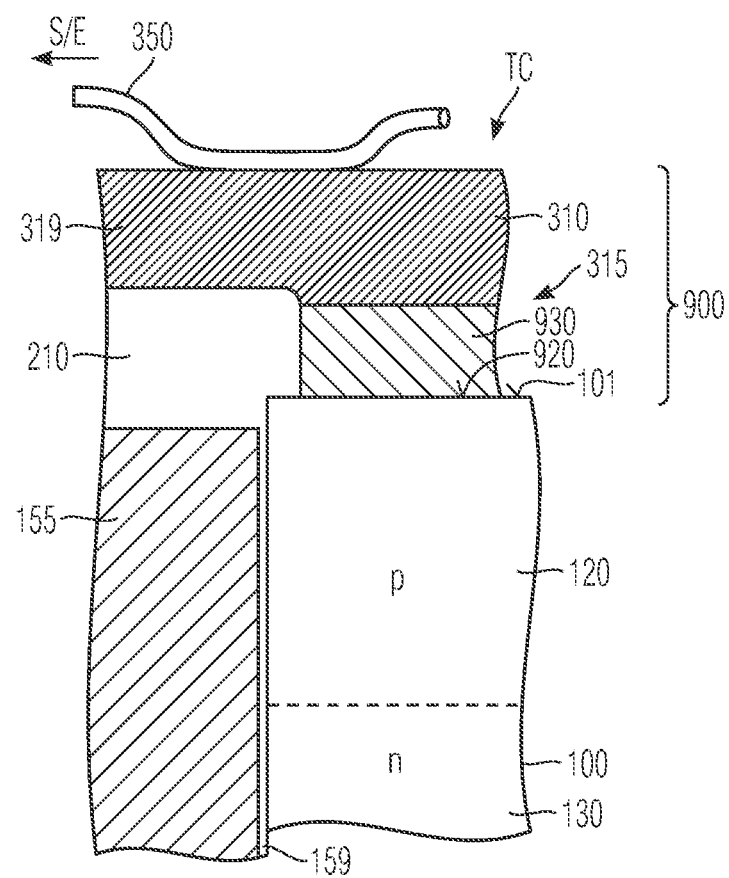
FIG. 4 shows a schematic vertical cross-sectional view of a portion of a semiconductor device according to an embodiment related to a resistive path with a resistive structure outside the semiconductor portion.

In FIG. 4 the load contact structure 315 includes a resistive structure 930 located in the opening of the interlayer dielectric 210. The resistive structure 930 may include a layer from a material with higher electrical resistivity than the material of a layer portion 319 of the load pad 310 formed on the interlayer dielectric 210.

The resistive path 900 includes a bond wire 350 connecting a source/emitter terminal S/E and the load pad 310, the load pad 310 including the load contact structure 315 with the resistive structure 930, and the metal/semiconductor contact 920. The resistive path 900 has an electrical resistance $R_{rp}$ of at least 1 mΩ*cm$^2$/$A_Q$. The resistive structure 920 has an electrical resistance $R_{str}$ of at least 0.1 mΩ*cm$^2$/$A_Q$, at least 0.5 mΩ*cm$^2$/$A_Q$ or at least 1 mΩ*cm$^2$/$A_Q$.

Figure 5:
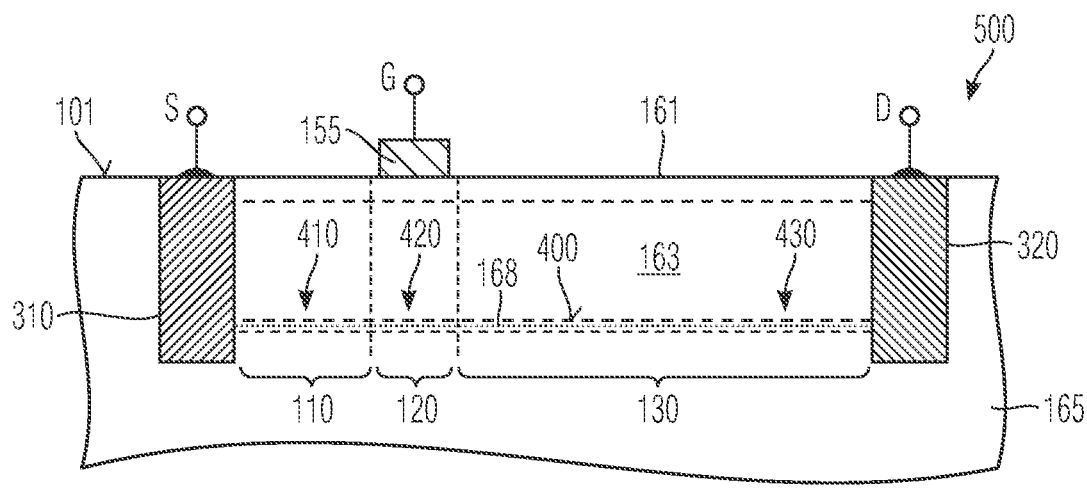
FIG. 5 shows a schematic vertical cross-sectional view of a portion of a semiconductor device according to an embodiment related to a normally-on HEMT (high electron mobility transistor).
Figure 6:
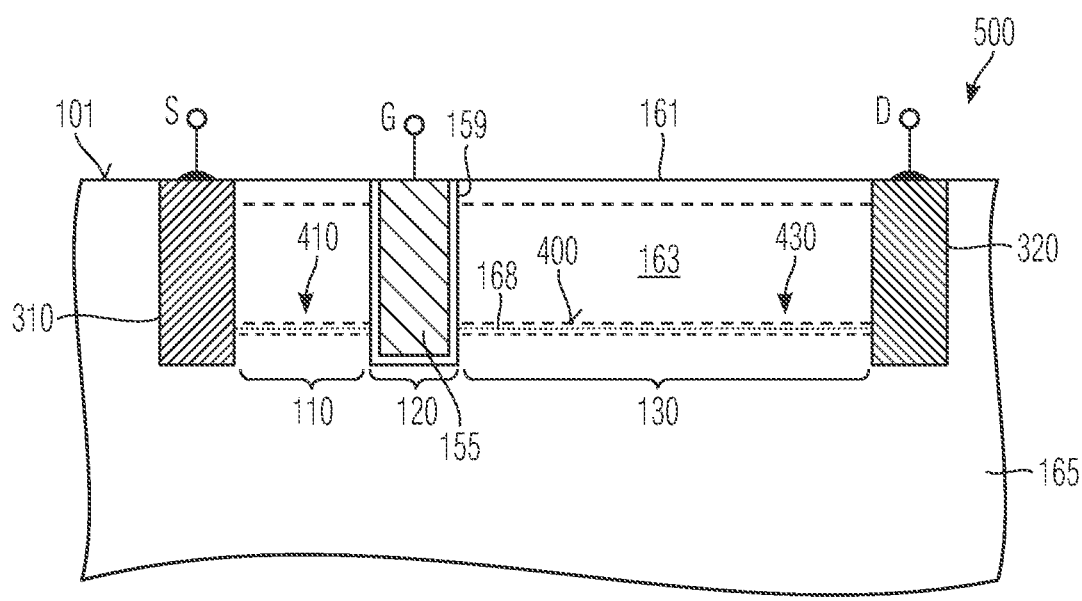
FIG. 6 shows a schematic vertical cross-sectional view of a portion of a semiconductor device according to an embodiment related to a normally-off HEMT (high electron mobility transistor) with gated MOS (metal oxide semiconductor) channel.
Figure 7:
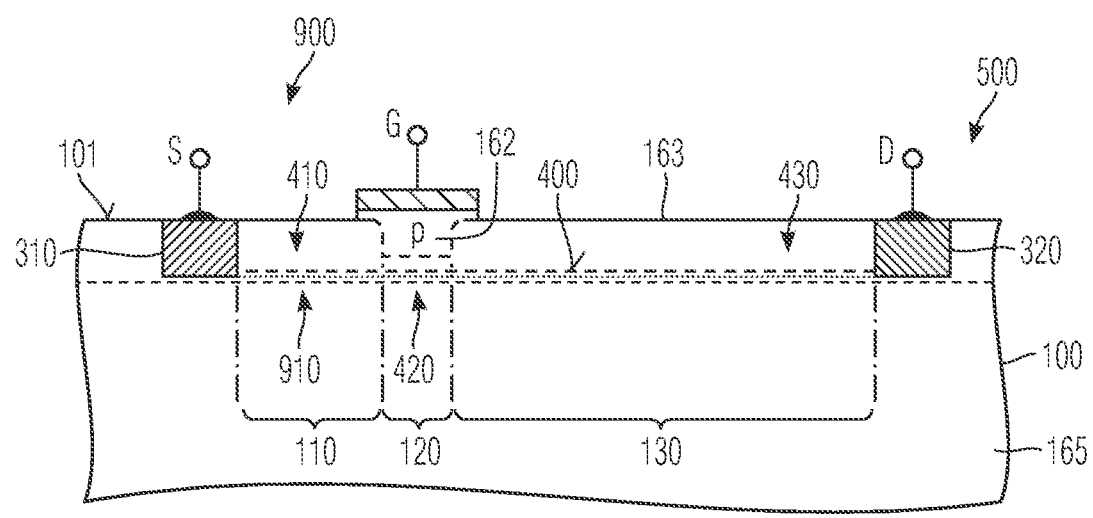
FIG. 7 shows a schematic vertical cross-sectional view of a portion of a semiconductor device according to an embodiment related to a normally-off GIT (gate injection transistor).

FIGS. 5 to 7 concern voltage controlled switching devices 500 including a heterojunction 400 formed between two different semiconductor materials with different band gaps.

The semiconductor portion 100 may include a barrier layer 163 from a first semiconductor material and a buffer layer 165 from a second semiconductor material. The first and second semiconductor materials have different band gaps. The barrier layer 163 is formed between a first surface 101 at a front side of the semiconductor portion 100 and the buffer layer 165. A capping layer 161 may be formed between the first surface 101 and the barrier layer 163. The first semiconductor material may be or may include AlGaN. The second semiconductor material may be or may include GaN, e.g. p doped GaN. The capping layer 161 may include GaN.

The buffer layer 165 and the barrier layer 163 may be in direct contact with each other, wherein the buffer layer 165 and the barrier layer 163 form the heterojunction 400.

Alternatively, a spacer layer and/or lattice matching layer may be formed between the buffer layer 165 and the barrier layer 163. Along the heterojunction 400 a 2DEG 168 forms in the buffer layer 165.

A first metal load structure 310 extends from the first surface 101 to below the heterojunction 400. The first metal load structure 310 is electrically connected to a source terminal S. At a lateral distance to the first metal load structure 310, a second metal load structure 320 extends from the first surface 101 to below the heterojunction 400. The second metal load structure 320 is electrically connected to a drain terminal D.

Between the first and second metal load structures 310, 320 a gate electrode 155 is formed on the first surface 101. The gate electrode 155 is electrically connected or coupled to a gate electrode G. A channel portion 420 of the heterojunction 400 and the 2DEG 168 below the gate electrode 155 forms the emitter channel region 120. A source-side portion 410 of the heterojunction 400 and the 2DEG between the first metal load structure 310 and the channel portion 420 correspond to a semiconducting section 910 of the resistive path 900 as described above. A drain-side portion 430 of the heterojunction 400 and the 2DEG between the channel portion 420 and the second metal load structure 320 correspond to a drain/drift structure 130 as described above.

In FIG. 5 the voltage-controlled switching device 500 is a normally-on HEMT with the heterojunction 400 laterally extending from the first metal load structure 310 to the second metal load structure 320. A suitable potential applied to the gate electrode 155 interrupts the 2DEG in the emitter channel region 120.

In FIG. 6 the voltage-controlled switching device 500 is a MOS-gated HEMT with the gate electrode 155 formed in a trench gate 150 extending from the first surface 101 to beyond the heterojunction 400. A gate dielectric 159 separates the gate electrode from the semiconductor portion 100. The trench gate 150 laterally separates the source-side portion 410 and the drain-side portion 430 of the 2DEG. In the on-state, a MOS-gated channel around the trench gate bottom connects the source-side portion 410 and the drain-side portion 430.

In FIG. 7 the voltage-controlled switching device 500 is a GIT with an injection layer 162 formed between the gate electrode 155 and the barrier layer 163. The injection layer 162 may locally extend into the barrier layer 163. The first semiconductor material forming the barrier layer 163 may include intrinsic AlGaN. The second semiconductor material forming the buffer layer 165 may include intrinsic GaN. The injection layer 162 may include p doped AlGaN.

The heterojunction 400 is formed with a gap in the 2DEG in the channel portion 420. A suitable potential applied to the gate electrode 155 injects charge carriers from the injection layer 162 in direction of the heterojunction 400. The injected charge carriers complement the 2DEG to a contiguous charge carrier channel between the first metal load structure 310 and the second metal load structure 320.

In each of FIGS. 5 to 7, in the source-side portion 410 the 2DEG is less dense and/or has a lower effective width than in the drain-side portion 430. For example, holes and/or dielectric structures extending through the plane of the 2DEG may narrow the current path and/or fixed charges provided in the vicinity of the source-side portion 410 may locally deplete the 2DEG. The fixed charges may be inserted into a dielectric structure formed above or below the 2DEG or extending through the 2DEG, by way of example.

Figure 8:
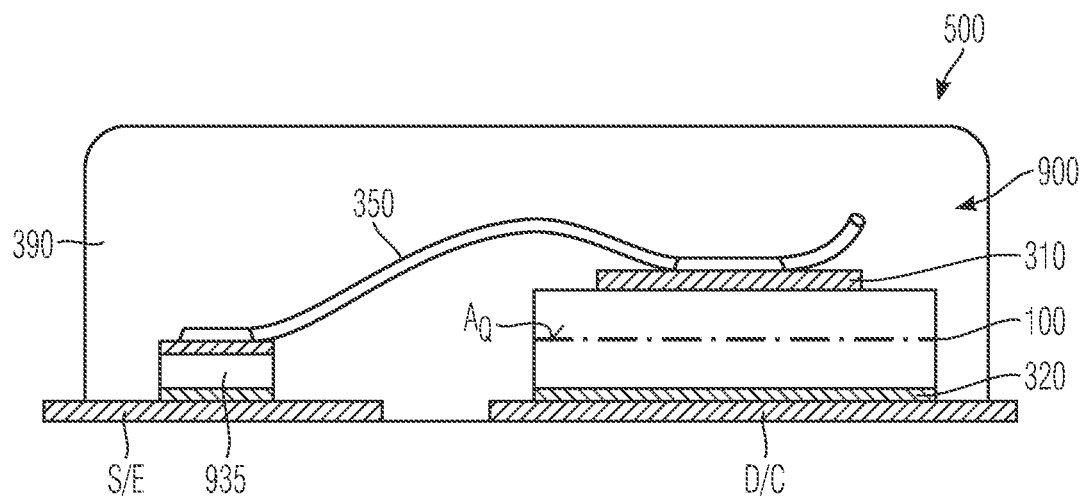
FIG. 8 shows a schematic vertical cross-sectional view of a portion of a semiconductor device according to an embodiment with a resistive element between a terminal lead and a load pad.

FIG. 8 shows a voltage-controlled switching device 500 including a semiconductor portion 100 with a load pad 310 formed at a front side and a metal layer 320 formed opposite to the front side. The metal layer 320 is bonded or soldered onto a terminal lead forming a drain/collector terminal D/C. The semiconductor portion 100 has a lateral cross-sectional area $A_Q$.

A first terminal of a resistive element 935 is bonded or soldered onto a terminal lead forming a source/emitter terminal S/E. A first end portion of a bond wire 350 is bonded onto a second terminal of the resistive element 935. A second end portion of the bond wire 350 is bonded onto the load pad 310. A molding compound 390 encapsulates the semiconductor portion 100 and the bond wire 350 and leaves portions of the terminal leads S/E, D/C exposed.

The resistive path 900 for each transistor cell TC includes the resistive element 935, the bond wire 350, the load pad 310, and a metal/semiconductor contact between the load pad 310 and the semiconductor portion 100. The resistive path 900 for each transistor cell TC has an electrical resistance $R_{rp}$ of at least 1 mΩ*cm²/$A_Q$. The resistive element 935 is in the resistive paths of each transistor cell TC and has an electrical resistance $R_{ele}$ of at least 0.1 mΩ*cm²/$A_Q$. For example, the electrical resistance $R_{ele}$ is at least 0.5 mΩ*cm²/$A_Q$ or at least 1 mΩ*cm²/$A_Q$.

FIG. 9 shows a voltage-controlled switching element with an emitter channel region 120 having a charge carrier mobility of at most 1000 cm²/(Vs) in case the minority charge carriers are electrons and at most 400 cm²/(Vs) in case the minority charge carriers are holes.

The resistive path 900 includes the bond wire 350 connecting a source/emitter terminal S/E and the load pad 310, the load pad 310 including the load contact structure 315, the metal/semiconductor contact 920, and the semiconducting section 910.

The electrical resistance $R_{rp}$ of the resistive path 900 and the charge carrier mobility in the emitter channel region 120 are selected such that in the short-circuit case a total voltage drop across the resistive path 900 and the emitter channel region 120 causes a voltage drop of at least 50% of the effective threshold voltage Veffth.

For example, the electrical resistance $R_{rp}$ of the resistive path is at most 0.1 mΩ*cm²/$A_Q$ and the charge carrier mobility in the emitter channel region 120 is at most 1000 cm²/(Vs) in case the minority charge carriers are electrons and at most 400 cm²/(Vs) in case the minority charge carriers are holes.

The embodiment of FIG. 9 can be combined with at least one of the embodiments of FIGS. 2A-2B, 3, 4 and 8 wherein the charge carrier mobility in the emitter channel region 120 and the electrical resistance in the resistive path are selected such that in the on-state the saturation current ICsat of the voltage-controlled switching device 500 causes a total voltage drop across the emitter channel region 120 and the resistive path 900 of at least 50% of the effective threshold voltage Veffth.

Figure 10A:
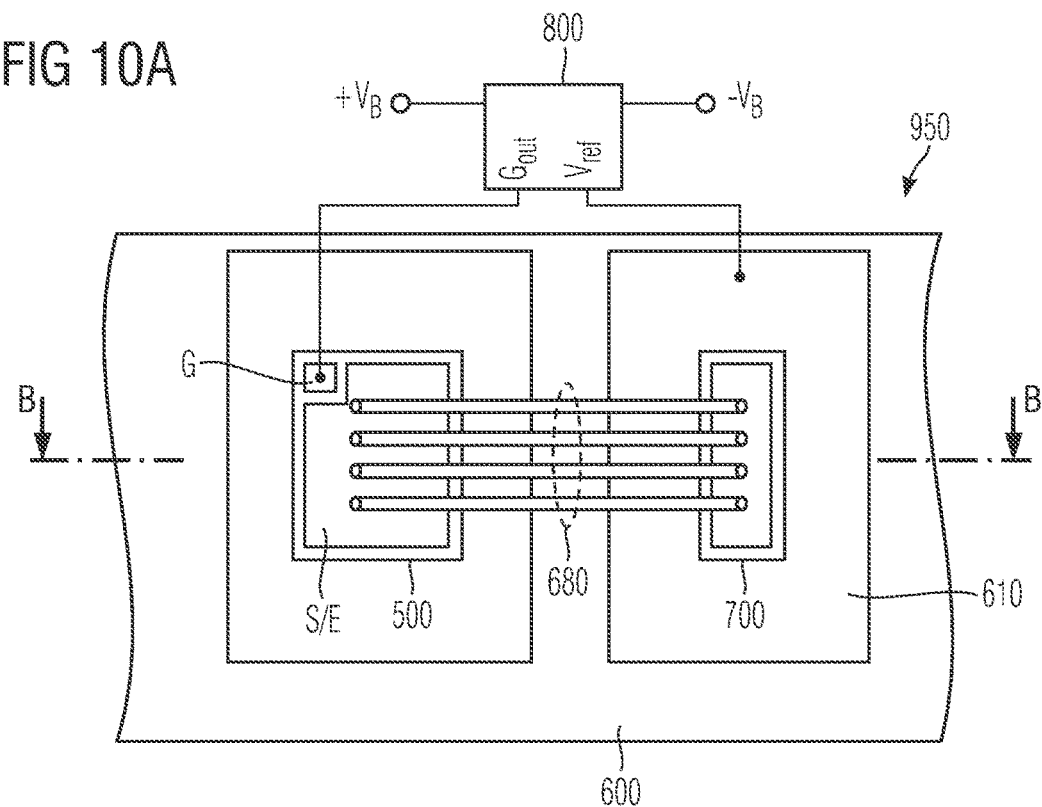
FIGS. 10A to 10C show a schematic plan view, a schematic cross-sectional view and a simplified circuit diagram of a switching assembly with a source path including a resistor element according to another embodiment.
Figure 10B:
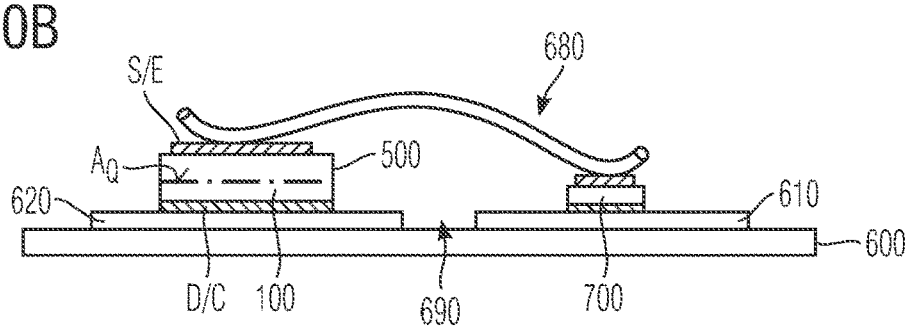
Figure 10C:
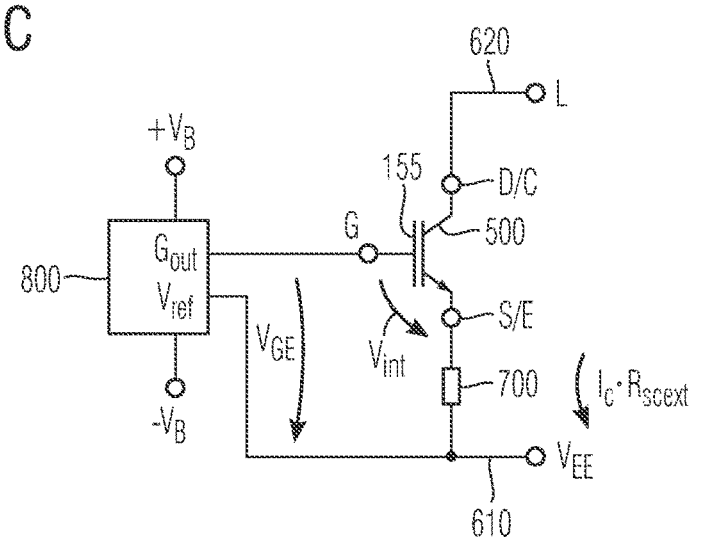

FIGS. 10A-10C concern a switching assembly 950 with a voltage-controlled switching device 500 and a resistor element 700 placed on a carrier substrate 600. The carrier substrate 600 may be a PCB (printed circuit board) or a DCB (direct copper bond) substrate.

The carrier substrate 600 includes a conductive first load wiring structure 610 and a conductive second load wiring structure 620. The first and second load wiring structures 610, 620 may be or may include metal pads formed side-by-side on a front side of the carrier substrate 600. A gap 690 laterally separates the first and second load wiring structures 610, 620.

A first terminal of a resistor element 700 is bonded onto the first load wiring structure 610. A drain/collector terminal D/C of a voltage-controlled switching device 500 as described above is bonded onto the second load wiring structure 620. In particular, the voltage-controlled switching device 500 has a threshold voltage of at most 1.2V and an areic transconductance of at least 5 kS/cm².

A connection structure 680 of the voltage-controlled switching device 500 electrically connects a source/emitter terminal S/E and a second terminal of the resistor element 700. The connection structure 680 may include one or more bond wires and/or a metal clip.

A gate output terminal Gout of a gate driver circuit 800 and a gate terminal G of the voltage-controlled switching device 500 are electrically connected. A reference terminal Vref of the gate driver circuit 800 and the first load wiring structure 610 are electrically connected. A positive supply voltage +VB (VDD, VCC) of the gate driver circuit 800 may be +1.5V. A negative supply voltage −VB (VSS, VEE) of the gate driver circuit 800 may be −1.5V. The gate driver circuit 800 is adapted to output a binary gate output signal at the gate output terminal Gout.

Between the first and second terminal, the resistor element 700 has an electrical resistance $R_{res}$ of at least 0.1 mΩ*cm²/$A_Q$, wherein $A_Q$ is the total cross-sectional area of the semiconductor portion 100 of the voltage-controlled switching device 500. For example, the electrical resistance $R_{res}$ is at least 0.5 mΩ*cm²/$A_Q$ or at least 1 mΩ*cm²/$A_Q$.

In particular, the electrical resistance $R_{res}$ is selected such that in the short-circuit case a total voltage drop across the resistor element 700 causes a voltage drop of at least 50% of the effective threshold voltage Veffth of the voltage-controlled switching device 500.

Figure 11:
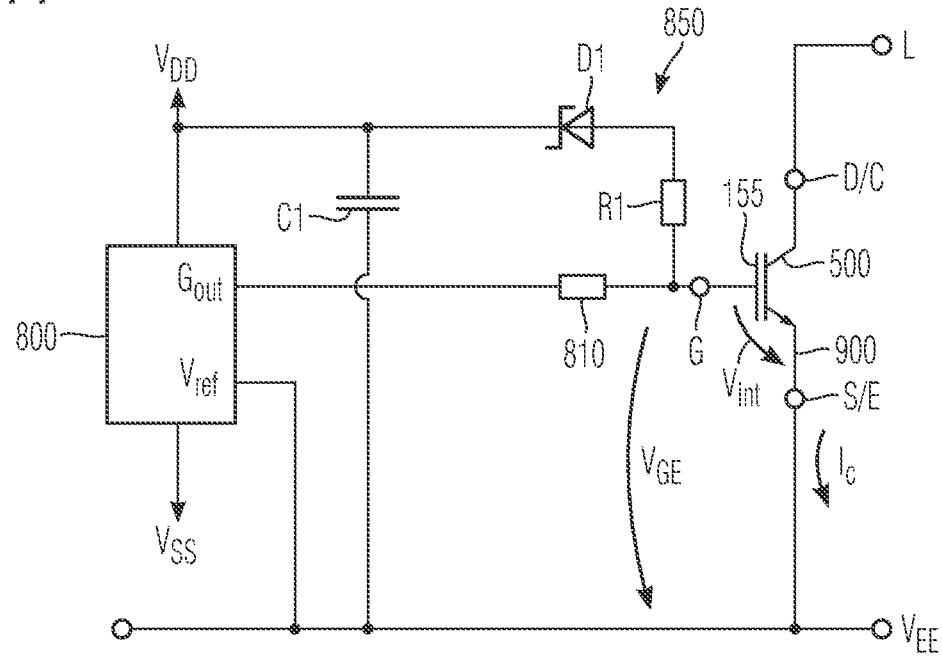
FIGS. 11 and 12 show simplified circuit diagrams of switching assemblies according to embodiments with clamp circuits in the gate path.

The switching assembly shown in FIG. 11 further includes a gate resistor 810 in the conductive path between the gate output terminal Gout of the gate driver circuit 800 and the gate terminal G of the voltage-controlled switching device 500.

In addition, a clamping circuit 850 includes a clamp resistor R1 and a clamp diode D1. Clamp diode D1 and clamp resistor R1 are electrically connected in series between a positive supply voltage VDD of the gate driver circuit 800 and the gate terminal G of the voltage-controlled switching device 500, wherein the cathode side of the clamp diode D1 is oriented to the positive supply voltage VDD of the gate driver circuit 800. The clamp diode D1 may be a Schottky diode with low forward voltage drop such that the gate overvoltage exceeds the positive supply voltage VDD only slightly. The resistance of the clamp resistor R1 may be significantly lower than the resistance of the gate resistor 810 such that clamping across the clamping diode D1 is more effective than across the gate driver output stage.

In the on-state of the voltage-controlled switching device 500, the clamping circuit 850 clamps a voltage at the gate electrode 155 to a value not higher than 35% of the high level voltage of the binary gate output signal.

While a Miller clamp keeps the low-level gate signal below the threshold voltage when the gate driver circuit 800 drives the off-level, the clamping circuit 850 clamps the high-level gate signal driving the on-level against overshooting. The clamping circuit 850 attenuates oscillations that may be caused by the feedback signal of the load current IC on the gate input voltage through the resistive path 900.

The gate driver circuit 800 and the voltage-controlled switching device 500 may be placed closed to each other to reduce parasitic inductance in the gate path. For example, the gate driver circuit 800 may be arranged onto a surface of the voltage-controlled switching device, wherein a bond wire may directly connect the gate output terminal Gout of the gate driver circuit 800 and the gate terminal G of the voltage-controlled switching device 500. Horizontal projections of a bond wire between gate output terminal Gout and gate terminal G and horizontals projections of bond wires connected to load pads may be tilted to each other, e.g. by 90 degrees in order to reduce magnetic coupling into the gate path.

Figure 12:
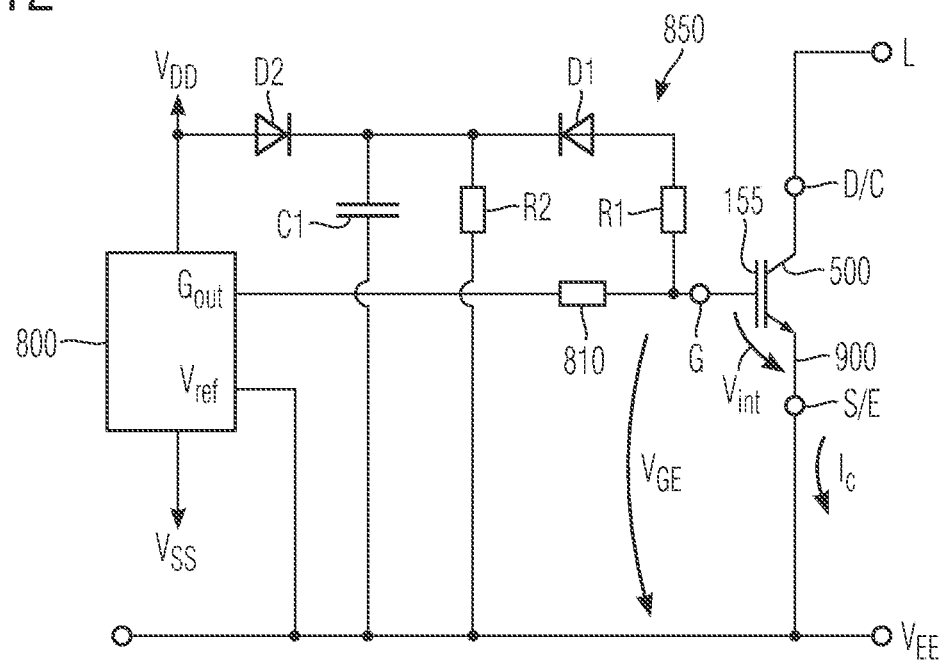

In FIG. 12 the clamping circuit 850 further includes an auxiliary diode D2 in the clamping path between the positive supply voltage VDD of the gate driver circuit 800 and the gate terminal G of the voltage-controlled switching device 500. The auxiliary diode D2 and the clamp diode D1 are oppositely oriented. An auxiliary capacitor C1 and an auxiliary resistor electrically connected in parallel connect the node between the clamp diode D1 and the auxiliary diode D2 with the reference potential connected to the reference terminal Vref of the gate driver circuit 800. The voltage at the cathodes of the clamp diode D1 and the auxiliary diode D2 is the positive supply voltage VDD reduced by the forward voltage of the auxiliary diode D2. If the set-in voltages of the clamp diode D1 and the auxiliary diode D2 are equal, the clamp diode D1 becomes conductive as soon as the voltage at the gate terminal G exceeds the positive supply voltage VDD.

Each of FIGS. 1A-1C, 2A-2B, and 3-8 shows a voltage-controlled switching device 500 with an emitter channel region 120 and a drain/drift structure 130, wherein the drain/drift structure 130 and the emitter channel region 120 form a semiconductor junction. The voltage-controlled switching device 500 further includes a source/emitter terminal S/E, wherein a resistive path 900 electrically connects the source/emitter terminal S/E and the emitter channel region. The voltage-controlled switching device 500 further includes a gate electrode 155 and a gate dielectric 159, wherein the gate dielectric 159 is between the gate electrode 155 and the emitter channel region 120.

The gate electrode 155, the gate dielectric 159 and the emitter channel region 120 are configured such that the voltage-controlled switching device 500 turns on when an internal voltage Vint effective between the gate electrode 155 and the emitter channel region 120 exceeds an effective threshold voltage Veffth. An electrical resistance $R_{rp}$ of the resistive path 900 is selected such that across the resistive path 900 a saturation current ICsat of the voltage-controlled switching device 500 causes a voltage drop of at least 50% of the effective threshold voltage Veffth.

FIG. 9 shows a voltage-controlled switching device 500 with an emitter channel region 120 and a drain/drift structure 130 of a first conductivity type. The drain/drift structure 130 and the emitter channel region 120 form a semiconductor junction, e.g. a unipolar junction or a pn junction. The voltage-controlled switching device 500 further includes a gate electrode 155 and a gate dielectric 159, wherein the gate dielectric 159 is between the gate electrode 155 and the emitter channel region 120. The gate electrode 155, the gate dielectric 159 and the emitter channel region 120 are configured such that the voltage-controlled switching device 500 turns on when an internal voltage Vint effective between the gate electrode 155 and the emitter channel region (120 exceeds an effective threshold voltage Veffth. An electrical resistance Rch of the emitter channel region 120 is selected such that when the voltage-controlled switching device 500 is turned on, a saturation current ICsat of the voltage-controlled switching device 500 causes a voltage drop of at least 50% of the effective threshold voltage Veffth across the emitter channel region 120.

Each of FIGS. 10A-10C, 11, and 12 refers to a switching assembly 950 that includes a substrate 600 including a first load wiring structure 610. A voltage-controlled switching device 500 is arranged on the substrate 600. The voltage-controlled switching device 500 includes an emitter channel region 120 and a drain/drift structure 130. The switching assembly 950 further includes a source/emitter terminal S/E, wherein a resistive path 900 electrically connects the source/emitter terminal S/E and the emitter channel region 120 and wherein the emitter channel region 120 is formed between the drain/drift structure 130 and the source/emitter terminal S/E. A gate dielectric 159 is between a gate electrode 155 and the emitter channel region 120. A resistor element 700 is electrically connected between the source/emitter terminal S/E and the first load wiring structure 610. The gate electrode 155, the gate dielectric 159 and the emitter channel region 120 are configured such that the voltage-controlled switching device 500 turns on when a gate-to-emitter voltage VGE between the gate electrode 155 and the first load wiring structure 610 exceeds a threshold voltage Vth. An electrical resistance of the resistor element 700 is selected such that a saturation current ICsat of the voltage-controlled switching device 500 causes a voltage drop of at least 50% of the threshold voltage Vth across the resistor element 700.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A voltage-controlled switching device, comprising:
a drain/drift structure formed in a semiconductor portion with a lateral cross-sectional area $A_Q$;
a source/emitter terminal; and
an emitter channel region between the drain/drift structure and the source/emitter terminal,
wherein a resistive path electrically connects the source/emitter terminal and the emitter channel region,
wherein the resistive path comprises a resistive structure,
wherein the resistive structure is formed between the source/emitter terminal and a semiconducting section,
wherein an electrical resistance of the resistive structure is at least $0.1\ m\Omega^*cm^2/A_Q$.

2. The voltage-controlled switching device of claim 1, wherein the resistive path comprises a metal/semiconductor contact, and
wherein an electrical contact resistance of the metal/semiconductor contact is at least $0.1\ m\Omega^*cm^2/A_Q$.

3. The voltage-controlled switching device of claim 1, wherein the resistive structure is formed between the semiconductor portion and a metal load pad, and
wherein a connection element connects the load pad and the source/emitter terminal.

4. The voltage-controlled switching device of claim 1, wherein the resistive path includes a resistive element located between the source/emitter terminal and a metal load pad,
wherein a metal connection element connects the load pad and the source/emitter terminal, and
wherein an electrical resistance of the resistive element is at least $0.1\ m\Omega^*cm^2/A_Q$.

5. The voltage-controlled switching device of claim 1, further comprising:
a source region connected to the source/emitter electrode, wherein the source region and the emitter channel region form a second semiconductor junction, and
wherein the emitter channel region separates the source region and the drain/drift structure.

6. A voltage-controlled switching device, comprising:
a drain/drift structure formed in a semiconductor portion;
a source/emitter terminal;
an emitter channel region between the drain/drift structure and the source/emitter terminal, wherein the emitter channel region and the drain/drift structure form a first semiconductor junction; and
a gate electrode configured to temporarily induce a charge carrier channel in a gated portion of the emitter channel region,
wherein in the gated portion, a mean minority charge carrier mobility at a temperature of 25° C. is at most $1000\ cm^2/(Vs)$ in case the minority charge carriers are electrons and at most $400\ cm^2/(Vs)$ in case the minority charge carriers are holes.

7. The voltage-controlled switching device of claim 6, wherein an areic transconductance of the voltage-controlled switching device is at least $5000\ S/cm^2$.

8. The voltage-controlled switching device of claim 6, wherein
an effective threshold voltage of the voltage-controlled switching device is at most 1.2V.

9. The voltage-controlled switching device of claim 6, wherein dopant concentration and lateral dimensions of the emitter channel region and a gate-to-channel threshold voltage are selected such that volume inversion takes place in the emitter channel region in an on state of the voltage-controlled switching device.

10. The voltage-controlled switching device of claim 6, wherein a smallest lateral dimension of the emitter channel region is at most 200 nm.

11. The voltage-controlled switching device of claim 6, further comprising:
a source region connected to the source/emitter electrode, wherein the source region and the emitter channel region form a second semiconductor junction, and
wherein the emitter channel region separates the source region and the drain/drift structure.

12. A switching assembly, comprising:
a first load wiring structure;
a voltage-controlled switching device comprising a drain/drift structure formed in a semiconductor portion with a lateral cross-sectional area $A_Q$, an emitter channel region formed in the semiconductor portion, and a source/emitter terminal, wherein the source/emitter terminal and the emitter channel region are electrically connected, and wherein the emitter channel region is formed between the source/emitter terminal and the drain/drift structure; and
a resistor element electrically connected between the source/emitter terminal and the first load wiring structure,
wherein an electrical resistance of the resistor element is at least $0.1\ m\Omega^*cm^2/A_Q$.

13. The switching assembly of claim 12, further comprising:
a gate driver circuit comprising a gate output terminal electrically connected to the gate electrode through a gate resistor, wherein the gate driver circuit is configured to output a binary gate output signal at the gate output terminal; and a clamping circuit configured to clamp, in an on-state of the voltage-controlled switching device, a voltage at the gate electrode to a value not higher than 35% of the high level of the binary gate output signal.

14. The switching assembly of claim 12,
wherein a first terminal of the resistor element is bonded onto the first load wiring structure, and
wherein the switching assembly further comprises:
  a connection structure that electrically connects the source/emitter terminal of the voltage-controlled switching device and a second terminal of the resistor element.

15. The switching assembly of claim 14, wherein the connection structure comprises one or more bond wires and/or a metal clip.

16. The switching assembly of claim 12, further comprising:
  a second load wiring structure separated from the first load wiring structure by a gap,
  wherein a drain/collector terminal of the voltage-controlled switching device is bonded onto the second load wiring structure.

17. A voltage-controlled switching device, comprising:
a drain/drift structure formed in a semiconductor portion with a lateral cross-sectional area $A_Q$;
a source/emitter terminal;
an emitter channel region between the drain/drift structure and the source/emitter terminal; and
a gate electrode configured to temporarily induce a charge carrier channel in a gated portion of the emitter channel region,
wherein a resistive path electrically connects the source/emitter terminal and the emitter channel region,
wherein the resistive path includes a source-side structure between the source/emitter terminal and the gated portion of the emitter channel region,
wherein the source-side structure is formed in the semiconductor portion, and
wherein an electrical resistance of the source-side structure is at least 0.1 m$\Omega$*cm$^2$/$A_Q$.

18. The voltage-controlled switching device of claim 17, wherein the source-side structure includes a semiconducting section between a first surface of the semiconductor portion and the gated portion of the emitter channel region.

19. The voltage-controlled switching device of claim 17,
wherein the drain/drift structure includes a drain-side portion of a heterojunction along which a two-dimensional electron gas forms,
wherein the source-side structure includes a source-side portion of the heterojunction, wherein the source-side portion is formed between the source/emitter terminal and the emitter channel region, and
wherein along the source-side portion the two-dimensional electron gas is less dense and/or has a lower effective width than along the drain-side portion.

* * * * *